(12) United States Patent
Vekris et al.

(10) Patent No.: US 6,426,280 B2
(45) Date of Patent: Jul. 30, 2002

(54) METHOD FOR DOPING SPHERICAL SEMICONDUCTORS

(75) Inventors: Evangellos Vekris; Nainesh J. Patel, both of Plano; Murali Hanabe, Dallas, all of TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/769,571

(22) Filed: Jan. 25, 2001

Related U.S. Application Data
(60) Provisional application No. 60/178,213, filed on Jan. 26, 2000.

(51) Int. Cl.$^7$ .............................................. H01L 21/225
(52) U.S. Cl. ......................................... 438/567; 438/568
(58) Field of Search ................................. 438/542, 558, 438/557, 563, 567, 568

(56) References Cited

U.S. PATENT DOCUMENTS

| | | | |
|---|---|---|---|
| 3,840,750 A | 10/1974 | Davis et al. ................. 250/547 |
| 3,986,905 A | * 10/1976 | Garavaglia | |
| 4,268,711 A | 5/1981 | Gurev ......................... 136/256 |
| RE31,473 E | 12/1983 | Kilby et al. .................. 425/6 |
| 4,490,192 A | * 12/1984 | Gupta et al. | |
| 4,749,615 A | 6/1988 | Bonny et al. ............ 428/310.6 |
| 4,786,477 A | 11/1988 | Yoon et al. .................. 422/145 |
| 4,788,082 A | 11/1988 | Schmitt .................... 427/248.1 |
| 4,812,166 A | * 3/1989 | Sakai et al. | |
| 5,178,743 A | 1/1993 | Kumar .................. 204/298.21 |
| 5,223,452 A | 6/1993 | Knepprath ................ 437/165 |
| 5,278,097 A | 1/1994 | Hotchkiss et al. .......... 437/164 |
| 5,462,639 A | 10/1995 | Matthews et al. ....... 156/662.1 |
| 5,560,543 A | 10/1996 | Smith et al. ............. 239/102.2 |
| 5,571,366 A | 11/1996 | Ishii et al. .................. 156/345 |
| 5,630,880 A | 5/1997 | Eastlund .................... 118/723 |
| 5,763,320 A | * 6/1998 | Stevens et al. .............. 438/563 |
| 5,772,771 A | 6/1998 | Li et al. ...................... 118/723 |
| 5,792,272 A | 8/1998 | van Os et al. .............. 118/723 |
| 5,811,022 A | 9/1998 | Savas et al. ................... 216/68 |
| 5,824,158 A | 10/1998 | Takeuchi et al. ........... 118/723 |
| 5,885,358 A | 3/1999 | Maydan et al. ............. 118/723 |
| 5,955,776 A | 9/1999 | Ishikawa .................... 257/618 |
| 6,015,464 A | 1/2000 | Xia et al. .................... 118/715 |
| 6,041,735 A | 3/2000 | Murzin et al. .............. 118/723 |
| 6,053,123 A | 4/2000 | Xia ............................ 118/723 |
| 6,055,928 A | 5/2000 | Murzin et al. .............. 118/723 |
| 6,117,772 A | 9/2000 | Murzin et al. .............. 438/681 |
| 6,120,602 A | 9/2000 | Stephens et al. ............ 117/200 |
| 6,179,922 B1 | 1/2001 | Ishikawa et al. ........... 118/716 |
| 6,221,165 B1 | 4/2001 | Zhang et al. ................ 118/723 |
| 6,331,477 B1 | * 12/2001 | Vekris et al. ................ 438/542 |

FOREIGN PATENT DOCUMENTS

JP 2119241 5/1990 ........... H01L/21/81

OTHER PUBLICATIONS

Wang, Ma, Golz, Halpern & Schmitt/High–Quality MNS Capacitors Prepared by Jet Vapor Deposition at Room Temperature/1992/pp. 12–14.

Heberlein & Pfender/Thermal Plasma Chemical Vapor Deposition/1993/pp. 1–7, 1–15.

Kong & Pfender/Synthesis of Ceramic Powders in a Thermal DC Plasma Jet by Injection of Liquid Precursors/1988/pp. 2–8.

\* cited by examiner

*Primary Examiner*—Savitri Mulpuri
(74) *Attorney, Agent, or Firm*—Haynes and Boone, LLP

(57) ABSTRACT

A method for doping crystals is disclosed. The method includes a receiver for receiving semiconductor spheres and doping powder. The semiconductor spheres and dopant powder are then directed to a chamber defined within an enclosure. The chamber maintains a heated, inert atmosphere with which to diffuse the dopant to the semiconductor spheres.

12 Claims, 3 Drawing Sheets

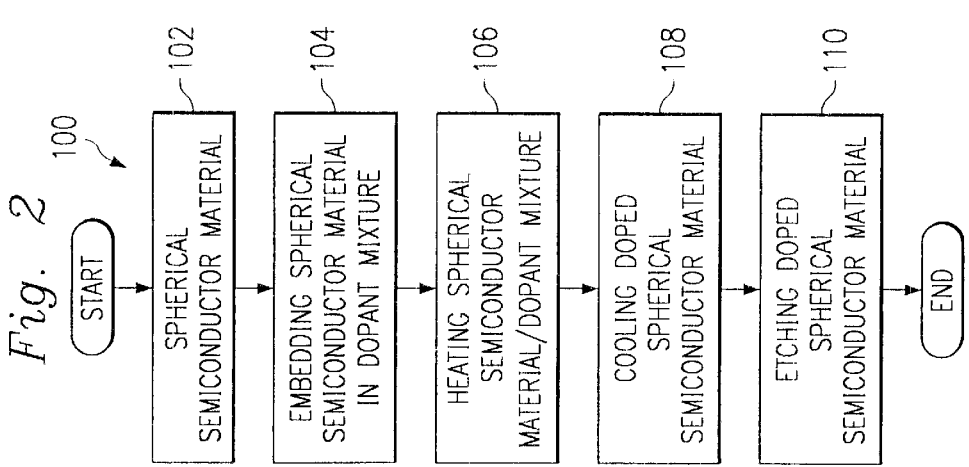

METHOD FOR DOPING SPHERICAL SEMICONDUCTORS

CROSS-REFERENCE

This invention claims the benefit of U.S. Provisional Patent Application No. 60/178,213 filed on Jan. 26, 2000.

BACKGROUND OF THE INVENTION

The invention relates generally to semiconductor devices, and more particularly, to a method for doping spherical-shaped semiconductors.

The doping process involves the controlled introduction of an impurity to a substrate, which produces subtle changes in the electrical resistivity of the material. Such characteristics are necessary for solid-state electronic semiconductor devices, such as the transistor.

In the conventional semiconductor industry, a doped silicon substrate is created by adding the doping impurity directly into the melt during the crystal-pulling process. The final crystal is a uniformly doped one, from which wafers may be cut to serve as doped substrates.

In the case of spherical semiconductors, the single crystal substrates are not produced from a melt, but rather are made by remelting polycrystalline silicon granules which are grown by gas-phase reaction in a fluidized bed reactor. The random and turbulent nature of the fluidized bed process makes the attainment of sample-to-sample doping uniformity difficult. Therefore, the granules cannot be doped during growth in the fluidized bed, and must be doped by external means.

In U.S. Pate. Nos. 5,278,097, 5,995,776, and 5,223,452, methods and apparatuses for doping spherical-shaped semiconductors are disclosed. However, an improved method of doping the spherical shaped semiconductors, which is simpler and more economical, is desired.

SUMMARY OF THE INVENTION

The present invention, accordingly, provides a method for doping spherical semiconductors. To this end, one embodiment provides a receiver for receiving semiconductor spheres and a dopant powder. The semiconductor spheres and dopant powder are then directed to a chamber defined within an enclosure. The chamber maintains a heated, inert atmosphere with which to diffuse the dopant properties of the dopant powder into the semiconductor spheres.

In one embodiment, the method of doping a plurality of spherical shaped semiconductors includes: embedding the plurality of spherical shaped semiconductors in a dopant mixture to produce a powder mixture; heating the powder mixture to produce a plurality of doped spherical shaped semiconductors; cooling the doped spherical shaped semiconductors; removing the doped spherical shaped semiconductors from the powder mixture; and chemically etching the doped spherical shaped semiconductors.

In one embodiment, the plurality of spherical shaped semiconductors are made from a commercially available semiconductor material.

In one embodiment, the plurality of spherical shaped semiconductors are p-type spherical single crystal substrates.

In one embodiment, the plurality of spherical shaped semiconductors are n-type spherical single crystal substrates.

In one embodiment, the plurality of spherical shaped semiconductors are oxidized spherical shaped semiconductors.

In one embodiment, the dopant mixture is a mixture of a dopant oxide and silicon dioxide.

In one embodiment, the dopant mixture is a dopant nitride.

In one embodiment, the dopant mixture is a mixture of antimony oxide/silicon dioxide ($Sb_2O_3/SiO_2$).

In one embodiment, the dopant mixture is a mixture of boric oxide/silicon dioxide ($B_2O_3/SiO_2$).

In one embodiment, heating the powder mixture comprises diffusion and/or viscous flow along the surface of the spherical shaped semiconductors.

In one embodiment, the dopant mixture is boron nitride (BN).

In one embodiment, the method is done in a non-oxidizing environment.

In one embodiment, the method further includes melting the doped spherical shaped semiconductors to produce uniformly doped spherical shaped semiconductors and cooling the uniformly doped spherical shaped semiconductors.

BRIEF DESCRIPTION OF THE DRAWINGS

FIG. 2 is a flow chart of a method for doping a spherical shaped semiconductor using the apparatus of FIG. 1.

FIG. 3 is a cross-sectional view of the apparatus of FIG. 1 in use during the method of FIG. 2.

DESCRIPTION OF THE PREFERRED EMBODIMENT

The present invention provides a method for doping substrates. The following description provides many different embodiments, or examples, for implementing different features of the invention. Certain techniques and components described in these different embodiments may be combined to form more embodiments. Also, specific examples of components, chemicals, and processes are described to help clarify the invention. These are, of course, merely examples and are not intended to limit the invention from that described in the claims.

Figure 1:
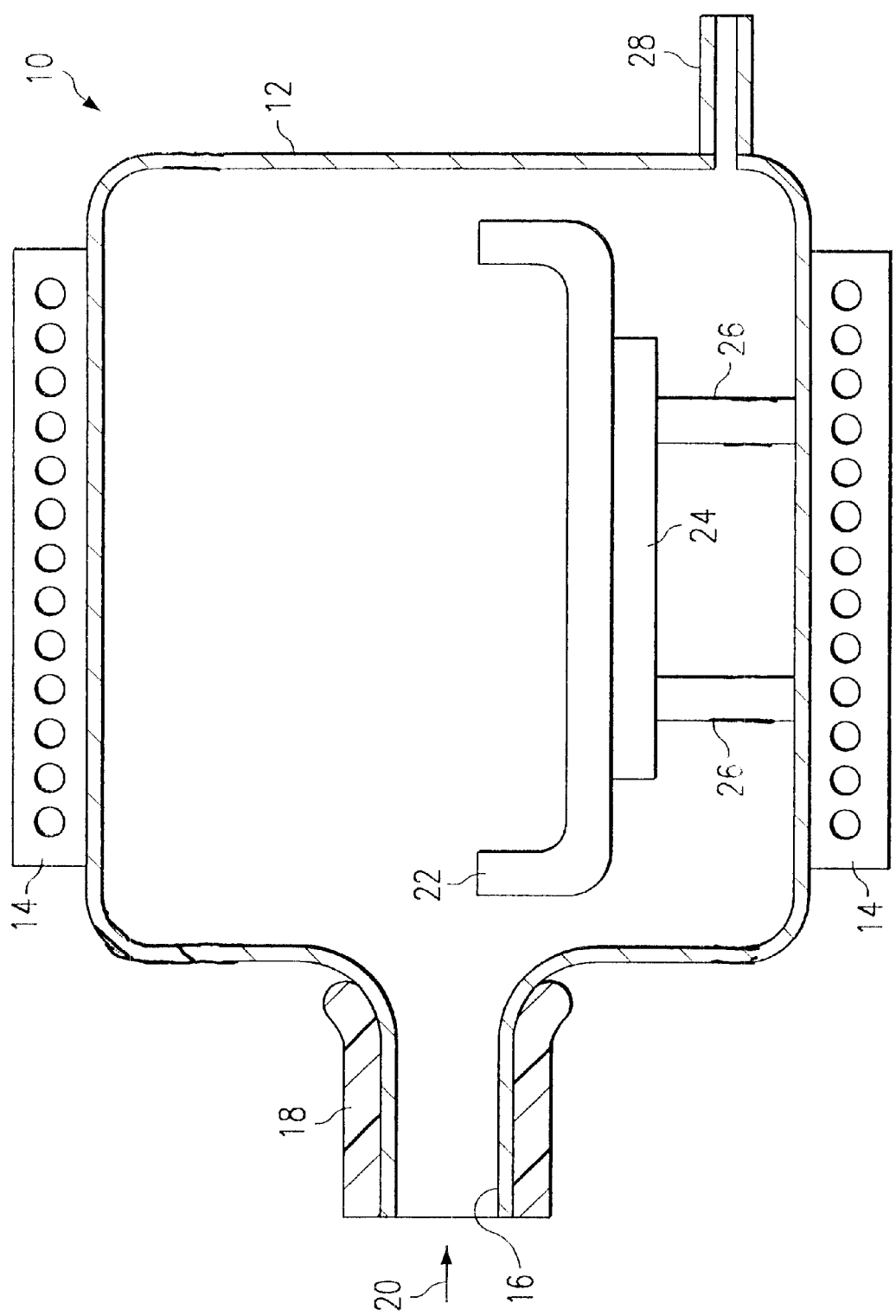
FIG. 1 is a cross-sectional view of an apparatus for use in doping spherical semiconductors according to one embodiment of the present invention.

Referring to FIG. 1, the reference numeral 10 designates, in general, one embodiment of an apparatus used for the doping of spherical semiconductors. The apparatus 10 includes a chamber 12 having a furnace 14 surrounding the chamber. The chamber 12 has an inlet port 16 at one end for connecting to an inlet line 18.

The inlet line 18 is used for allowing a gas source 20 to enter the chamber 12. The chamber 12 includes a boat 22 which can be held in place by a base 24 which is connected to one or more legs 26. The boat 22 may be, for example, quartz or alumina. In a preferred embodiment, the boat 22 is quartz.

The chamber 12 also includes an outlet line 28 for exhausting the gas source 20.

Referring to FIGS. 2 and 3, a method 100 may be used in conjunction with the apparatus 10. The method 100 is preferably performed in an inert atmosphere. At step 102, a plurality of spherical semiconductors 30 is placed in the boat 22. The spherical semiconductors 30 may be, for example, any commercially available spherical semiconductor material, any oxidized spherical semiconductor material, an n-type spherical single crystal substrate, or a p-type spherical single crystal substrate. In a preferred embodiment, the spherical semiconductors 30 are silicon.

At step 104, a dopant mixture 32 is placed in the boat 22 containing the spherical semiconductors 30. The spherical semiconductors 30 are embedded within the dopant mixture 32. The dopant mixture 32 preferably has particles that are approximately less than 1 $\mu$m in size. The dopant mixture 32 may be, for example, any dopant oxide mixed with silicon dioxide ($SiO_2$) or any dopant nitride. In a preferred embodiment, the dopant mixture 32 is an antimony oxide/silicon dioxide ($Sb_2O_3/SiO_2$) mixture. The ratio of the dopant oxide/silicon dioxide mixture is chosen to maximize the viscosity of the dopant mixture 32 and to maximize the amount of the dopant oxide in the dopant mixture 32.

At step 106, the boat 22 is placed within the chamber 12 and the chamber 12 is subjected to a predetermined thermal cycle. In a preferred embodiment, at the process temperature, antimony oxide is transferred from the dopant mixture 32 to the surface of the spherical semiconductors 30. This is accomplished by diffusion and/or viscous flow along the surface of the powder particles of the dopant mixture 32 which are in intimate contact with the spherical semiconductors 30. In a preferred embodiment, elemental antimony is further diffused to a shallow depth into the spherical semiconductors 30.

At step 108, the boat 22 is cooled and removed from the chamber 12. The spherical semiconductors 30 are doped with antimony and are removed from the dopant mixture 32.

At step 110, the spherical semiconductors 30 doped with antimony, are chemically etched to remove any oxide/powder layer. The spherical semiconductors 30 doped with antimony may be chemically etched by any commercially available chemical etching process.

In an alternate embodiment, the method 100 further includes melting the spherical semiconductors 30 doped with antimony to produce spherical semiconductors 30 uniformly doped with antimony upon cooling.

In an alternate embodiment of the method 100, the dopant mixture 32 is a boric oxide/silicon dioxide ($B_2O_3/SiO_2$) mixture. In this embodiment, the semiconductors 30 would first be oxidized (in a prior, separate step), and then mixed with and submersed in a bed of BN powder. During the process, the BN powder would react and bond with the oxide on the surface of the spherical semiconductors and the transfer of Boron would take place. After the process, the semiconductors 30 would be chemically etched to remove the layer of oxide/powder. The process would be done under a non-oxidizing atmosphere to prevent oxidation of the BN powder, thus allowing it to be reused fro subsequent treatments.

In an alternate embodiment of the method 100, the spherical semiconductors 30 are a p-type spherical single crystal substrate and the dopant mixture 32 is an antimony oxide/silicon dioxide ($Sb_2O_3/SiO_2$) mixture. The spherical semiconductors 30 are doped to produce a p-n junction near the surface of the spherical semiconductors 30.

In an alternate embodiment of the method 100, the spherical semiconductors 30 are an n-type spherical single crystal substrate and the dopant mixture 32 is a boron oxide/silicon dioxide ($B_2O_3/SiO_2$) mixture. The spherical semiconductors 30 are doped to produce a p-n junction near the surface of the spherical semiconductors 30.

In an alternate embodiment of the method 100, the spherical semiconductors 30 are oxidized spherical semiconductors and the dopant mixture 32 is boron nitride (BN).

Figure 4:
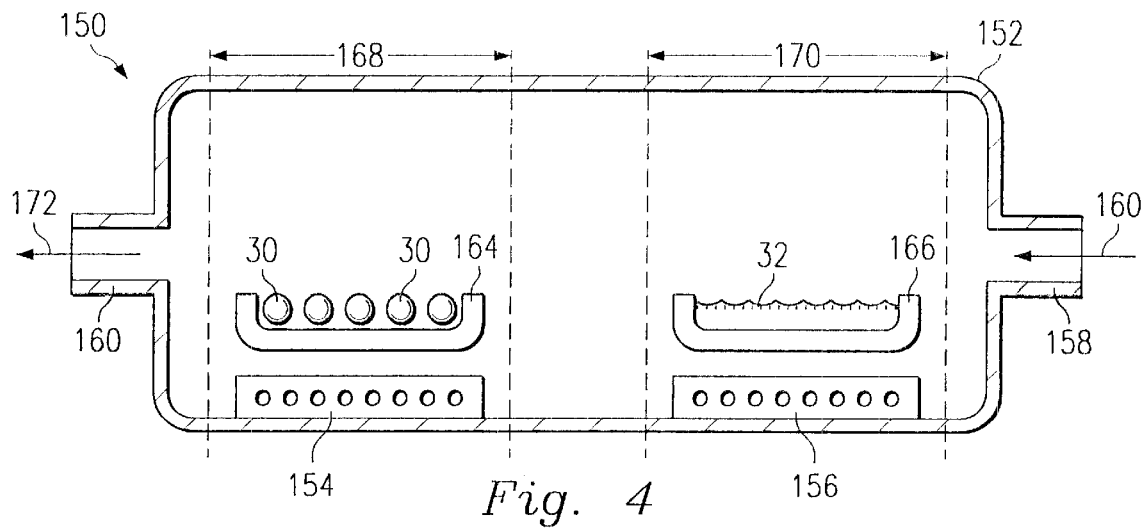
FIGS. 4–6 are cross-sectional views of apparatuses for use in doping spherical semiconductors according to other embodiments of the present invention.

Referring now to FIG. 4, the reference numeral 150 designates, in general, another embodiment of an apparatus used for the doping of spherical semiconductors. The apparatus 150 includes a chamber 152 having two furnaces 154, 156 associated with the chamber. The chamber 152 has an inlet port 158 at one end and an opposing outlet port 160. The apparatus 150 can be used with the method 100, as described above.

The inlet port 158 is used for allowing a carrier gas 162 to enter the chamber 152, similar to the carrier gas from the gas source 20 of FIG. 1. The chamber 152 includes a first boat 164 and a second boat 166, both similar to the boat 22 of FIG. 1.

The first boat 164 and the first heater 154 are positioned in a first area of the chamber 152, herein designated as the diffusion zone 168. The second boat 166 and the second heater 156 are positioned in a second area of the chamber 152, herein designated as the vaporization zone 170. Although the diffusion zone 168 and the vaporization zone 170 are illustrated as being in a single, common chamber 152, in other embodiments, they may be in separate chambers.

In the present embodiment, the first boat 164 includes a plurality of spherical semiconductors 30 and the second boat 166 has the dopant mixture 32. The dopant mixture 32 may be as described in FIG. 3. However, in the present embodiment, the dopant mixture 32 and the spherical semiconductors 30 are kept separate from each other. In this way, different processing environments can be maintained in the different zones 168, 170. For example, the temperature of the vaporization zone 170 may be higher than that of the diffusion zone 168.

In operation, the dopant material 32 is heated by the heater 156 and vaporizes in the vaporization zone 170. The carrier 160 moves through the vaporization zone 170 and carries the vaporized dopant into the diffusion zone 168. At this time, the vaporized dopant comes in uniform contact with the spherical semiconductors 30. Diffusion may then occur on the semiconductors. Exhaust 172 from the process may be expelled through the outlet 160.

Figure 5:
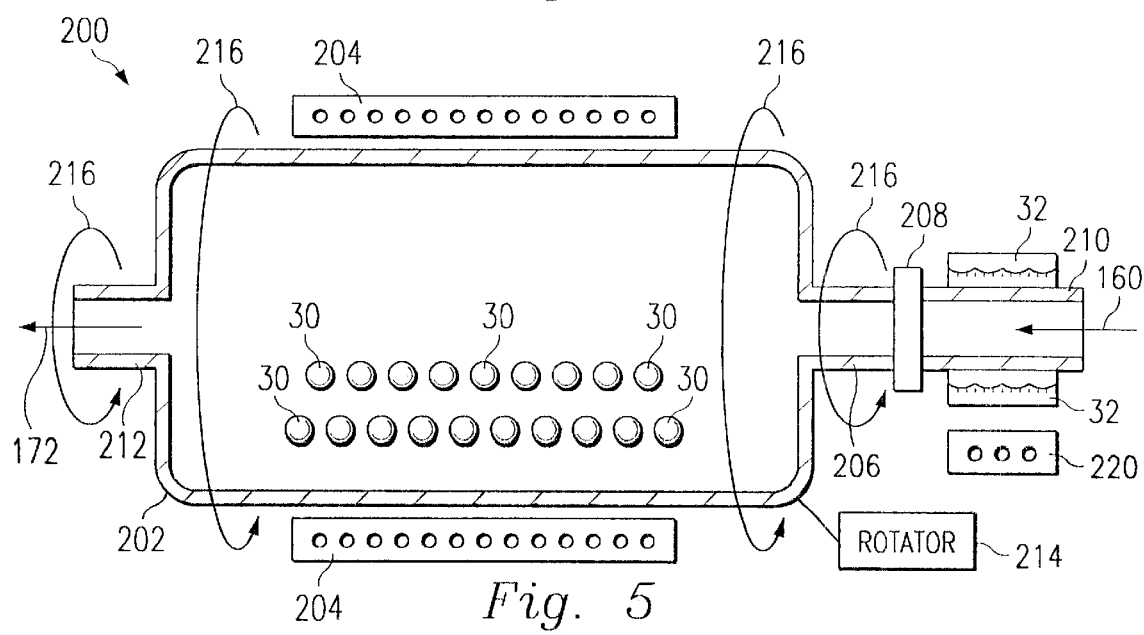

Referring now to FIG. 5, the reference numeral 200 designates, in general, yet another embodiment of an apparatus used for the doping of spherical semiconductors. The apparatus 200 includes a first chamber 202 having a furnace 204. The chamber 202 has an inlet port 206 at one end connected by a coupling 208 to a second chamber 210. Opposing the inlet 206 is an outlet port 212. The apparatus 200 can be used with the method 100, as described above.

The first chamber 202 is connected to a rotating device 214 for rotating the chamber, as illustrated by the arrows 216. The rotator 214 may be any mechanical means, such as a small motor assembly. The rotation 216 allows a plurality of spherical semiconductors 30 to move inside the first chamber 202.

The second chamber 210 does not have to rotate. Instead, the coupling 208 allows the first and second chambers 202, 210 to remain connected while only one rotates. In other embodiments, the second chamber 210 may also rotate. The second chamber 210 also includes a heater 220 and the dopant mixture 32, such as is described in FIG. 3. However, like the embodiment of FIG. 4, the dopant mixture 32 and the spherical semiconductors 30 are kept separate from each other. In this way, different processing environments can be maintained in the different chambers 202, 210 For example, the temperature of the second chamber 210 may be higher than that of the first chamber 202.

In operation, the dopant material 32 is heated by the heater 220 and vaporizes in the second chamber 210. A carrier gas 160 moves through the second chamber 210 and associates with the vaporized dopant. The carrier gas and vaporized dopant then move into the first chamber 202. At this time, the vaporized dopant comes in contact with the spherical semiconductors 30. Diffusion may then occur on the semiconductors. The rotation 216 of the first chamber 202 helps to encourage uniform contact between the vaporized dopant and the spherical semiconductors 30. Exhaust 172 from the process may be expelled through the outlet 212.

Figure 6:
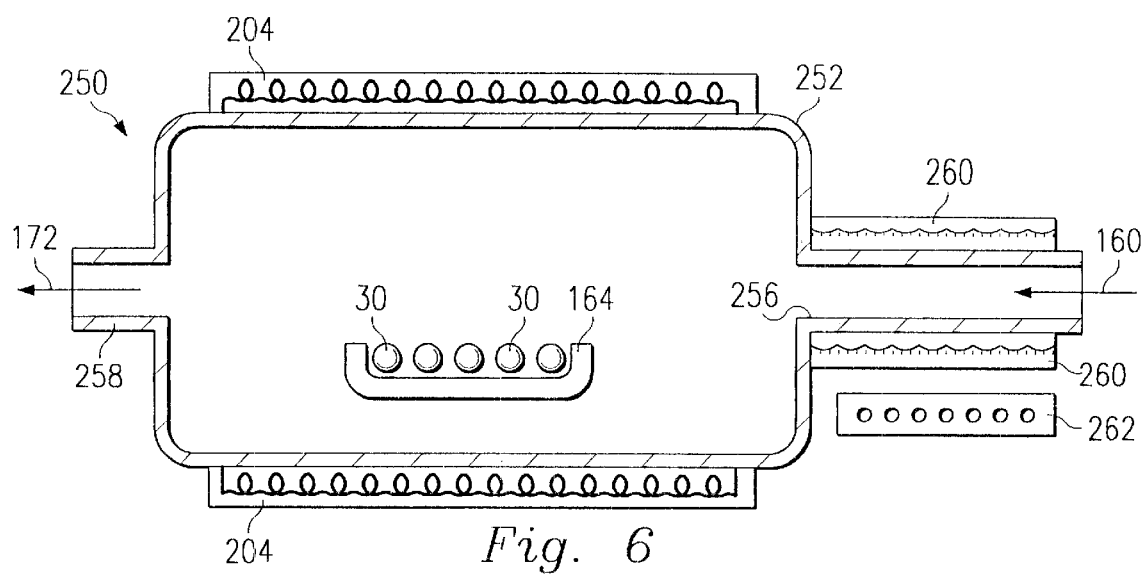

Referring now to FIG. 6, the reference numeral 250 designates, in general, still another embodiment of an apparatus used for the doping of spherical semiconductors. The apparatus 250 includes a chamber 252 having a furnace 204. The furnace 204 of FIG. 6 is illustrated as a conductive coil, although many types of heaters can be used. The chamber 252 has an inlet port 256 and an opposing outlet port 258. The chamber 152 also includes a boat 164, similar to that shown in FIG. 4, for containing a plurality of spherical semiconductors 30. The apparatus 250 can be used with the method 100, as described above.

The inlet port 256 of the chamber 252 is connected to a dopant sleeve 260 associated with a heater 262. The dopant sleeve 260 includes a solid dopant material such as $Sb_2O_3$, $P_2O_5$, $B_2O_3$, BN, P, Sb, or $SiP_2O_7$. The solid dopant material may be similar to the dopant material 32 of FIG. 3. Like the embodiment of FIG. 4, the dopant material from the sleeve 269 and the spherical semiconductors 30 are kept separate from each other. In this way, different processing environments can be maintained in the different chambers 252, 210.

In operation, the dopant material in the sleeve 260 is heated by the heater 262 and vaporizes. A carrier gas 160 moves through the dopant sleeve 260 and associates with the vaporized dopant. The carrier gas and vaporized dopant then move into the chamber 252. At this time, the vaporized dopant comes in contact with the spherical semiconductors 30. Diffusion may then occur on the semiconductors. Exhaust 172 from the process may be expelled through the outlet 258.

Several advantages result from the above-described embodiments. For one, the spherical semiconductors seldom, if ever, come in physical contact with any other device or any part of the apparatus 10.

It is understood that several variations may be made in the foregoing. For example, different heating mechanisms may be used with the apparatus. Other modifications, changes and substitutions are also intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method of doping a plurality of spherical shaped semiconductors, the method comprising the steps of:
    embedding the plurality of spherical shaped semiconductors in a dopant mixture to produce a powder mixture;
    heating the powder mixture to produce a plurality of doped spherical shaped semiconductors, wherein heating the powder mixture comprises diffusion and viscous flow along the surface of the spherical shaped semiconductors;
    cooling the doped spherical shaped semiconductors;
    removing the doped spherical shaped semiconductors from the powder mixture; and
    etching the doped spherical shaped semiconductors.

2. The method of claim 1, wherein the plurality of spherical shaped semiconductors are polycrystalline semiconductor substrates.

3. The method of claim 1, wherein the plurality of spherical shaped semiconductors are p-type spherical single crystal substrates.

4. The method of claim 1, wherein the plurality of spherical shaped semiconductors are n-type spherical single crystal substrates.

5. The method of claim 1, wherein the plurality of spherical shaped semiconductors are oxidized spherical shaped semiconductors.

6. The method of claim 1, wherein the dopant mixture is a mixture of a dopant oxide and silicon dioxide.

7. The method of claim 1, wherein the dopant mixture is a dopant nitride.

8. The method of claim 1, wherein the dopant mixture is a mixture of antimony oxide/silicon dioxide ($Sb_2O_3/SiO_2$).

9. The method of claim 1, wherein the dopant mixture is a mixture of boric oxide/silicon dioxide ($B_2O_3/SiO_2$).

10. The method of claim 1, wherein the dopant mixture is boron nitride (BN).

11. The method of claim 1, further comprising:
    providing a non-oxidizing environment during the heating step.

12. The method of claim 1, further comprising
    melting the doped spherical shaped semiconductors to produce uniformly doped spherical shaped semiconductors; and
    cooling the uniformly doped spherical shaped semiconductors.

* * * * *